United States Patent
Kondo et al.

(10) Patent No.: US 7,183,212 B2
(45) Date of Patent: *Feb. 27, 2007

(54) POLISHING METHOD, METALLIZATION FABRICATION METHOD, METHOD FOR MANUFACTURING SEMICONDUCTOR DEVICE AND SEMICONDUCTOR DEVICE

(75) Inventors: Seiichi Kondo, Kokubunji (JP); Masaaki Fujimori, Hatoyama (JP); Noriyuki Sakuma, Hachioji (JP); Yoshio Homma, Hinode (JP)

(73) Assignee: Renesas Technology Corp., Tokyo (JP)

( * ) Notice: Subject to any disclaimer, the term of this patent is extended or adjusted under 35 U.S.C. 154(b) by 43 days.

This patent is subject to a terminal disclaimer.

(21) Appl. No.: 10/898,252

(22) Filed: Jul. 26, 2004

(65) Prior Publication Data

US 2004/0266188 A1 Dec. 30, 2004

Related U.S. Application Data

(63) Continuation of application No. 09/637,570, filed on Aug. 14, 2000, now Pat. No. 6,774,041.

(30) Foreign Application Priority Data

Dec. 27, 1999 (JP) ................... 11-368640

(51) Int. Cl.
*H01L 21/302* (2006.01)
(52) U.S. Cl. .................. 438/691; 257/E21.23
(58) Field of Classification Search .......... 438/689, 438/691, 745, 754
See application file for complete search history.

(56) References Cited

U.S. PATENT DOCUMENTS

| | | | |
|---|---|---|---|
| 4,944,836 A | 7/1990 | Beyer et al. | |
| 4,954,141 A * | 9/1990 | Takiyama et al. | 51/296 |
| 5,860,848 A | 1/1999 | Loncki et al. | |
| 6,063,306 A | 5/2000 | Kaufman et al. | |
| 6,221,118 B1 | 4/2001 | Yoshida et al. | |
| 6,276,996 B1 | 8/2001 | Chopra | |
| 6,303,049 B1 | 10/2001 | Lee et al. | |
| 6,451,697 B1 | 9/2002 | Sun et al. | |
| 6,607,424 B1 | 8/2003 | Costas et al. | |

FOREIGN PATENT DOCUMENTS

| | | |
|---|---|---|
| JP | 55-047382 | 4/1980 |
| JP | 55-36269 | 9/1980 |

(Continued)

OTHER PUBLICATIONS

"Science of CMP", Aug. 20, 1997, pp. 299-303.

(Continued)

*Primary Examiner*—Scott B. Geyer
(74) *Attorney, Agent, or Firm*—Mattingly, Stanger, Malur & Brundidge, P.C.

(57) ABSTRACT

Described is a polishing technique adapted for multilevel metallization of an electronic circuit device, which comprises polishing a metal film with a polishing liquid containing an oxidizing substance, a phosphoric acid and a protection-layer forming agent. The present invention makes it possible to polishing a metal film at a high removal rate while suppressing occurrence of scratches, delamination, dishing or erosion.

18 Claims, 11 Drawing Sheets

FOREIGN PATENT DOCUMENTS

| | | |
|---|---|---|
| JP | 2-278822 | 11/1990 |
| JP | 6-057455 | 3/1994 |
| JP | 7-094455 | 4/1995 |
| JP | 10-265766 | 10/1998 |
| JP | 11-021546 | 1/1999 |
| JP | 11-135466 | 5/1999 |

OTHER PUBLICATIONS

Sax et al, Hawley's Condensed Chemical Dictionary, 11$^{th}$ Ed., Van Nostrand Reinhold Co., 1987, p. 910.

* cited by examiner

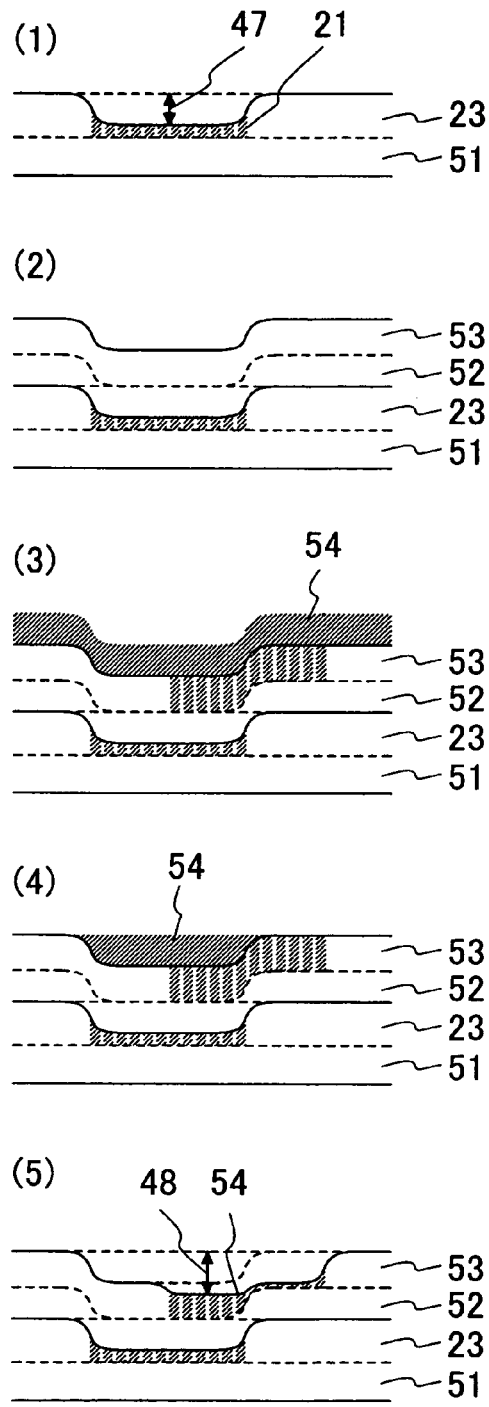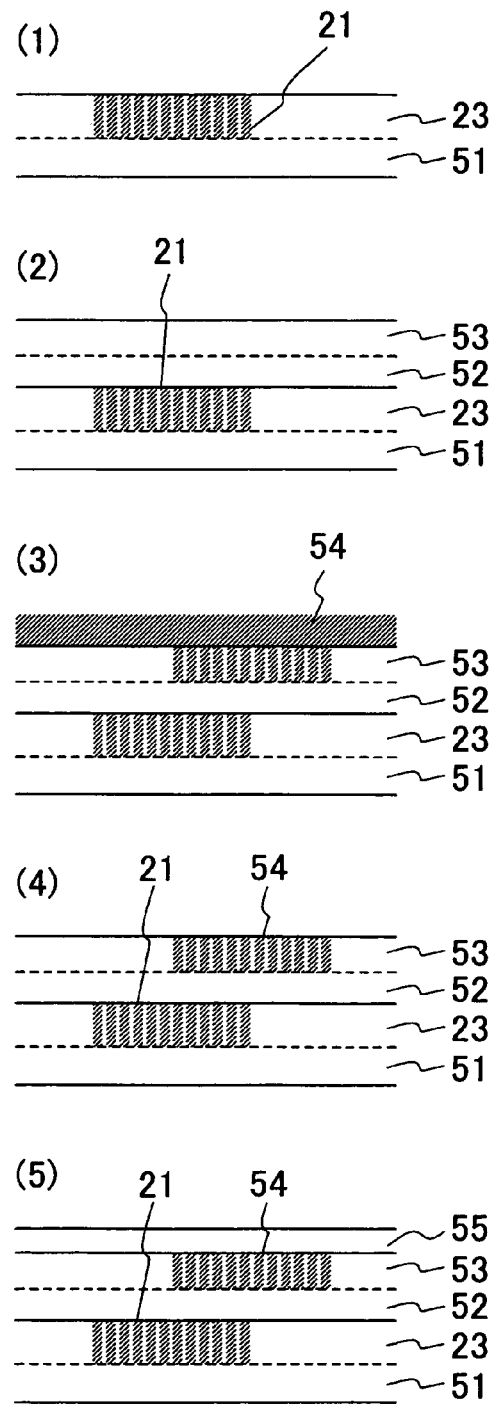

POLISHING METHOD, METALLIZATION FABRICATION METHOD, METHOD FOR MANUFACTURING SEMICONDUCTOR DEVICE AND SEMICONDUCTOR DEVICE

This is a continuation application of U.S. Ser. No. 09/637,570, filed Aug. 14, 2000, now U.S. Pat. No. 6,774,041.

BACKGROUND OF THE INVENTION

1. Field of the Invention

This invention relates to a polishing technique of a metal film, particularly to a polishing method adapted for the formation of multilevel metallization of an electronic circuit device such as semiconductor device.

2. Description of the Related Art

With a recent tendency to high integration and performance improvement of a semiconductor integrated circuit device (which will hereinafter be abbreviated as "LSI"), novel micro fabrication techniques have been developed. Chemical mechanical polishing (which will hereinafter be called "CMP (chemical mechanical polishing)") is one of such techniques and it is frequently employed in an LSI fabrication process, particularly, planarization of an interlayer dielectric layer in a multilevel metallization process, formation of a metal plug and formation of inlaid interconnect. This technique is disclosed in, for example, U.S. Pat. No. 4,944,836.

Recently, there has been an attempt to use a low-resistant copper (Cu) alloy instead of the conventionally used aluminum (Al) alloy as a metallization material with a view to imparting an LSI with high-speed performance. The Cu alloy is however unsuited for micro fabrication by dry etching which has been frequently employed for the metallization using an Al alloy.

Accordingly, a so-called damascene method which comprises depositing a Cu-alloy thin film over an insulating film having a groove formed therein, and removing the Cu-alloy thin film other than a portion embedded in the groove by CMP, thereby forming an inlaid interconnect has been adopted mainly.

This technique is disclosed, for example, in Japanese Patent Application Laid-Open No. Hei 2-278822. It is the common practice to insert a barrier metal film such as titanium nitride (TiN) film, tantalum (Ta) film or tantalum nitride (TaN) film having a thickness of about tens of nm between the Cu-alloy thin film and the insulating film in order to improve their adhesion and form a barrier against Cu diffusion.

Conventionally, a polishing liquid used for CMP of a metal film such as Cu alloy upon metallization is usually composed mainly of a polishing abrasive and an oxidizing substance (which may be called "oxidizer").

The principal mechanism of CMP is to, while oxidizing the surface of a metal film by the oxidizing action of an oxidizing substance, mechanically remove the resulting oxide by the polishing abrasive, which is disclosed in page 299 of "Science of CMP" ed. by Masahiro Kashiwagi, publ. by Science Forum K.K. on Aug. 20, 1997.

Although an alumina abrasive or silica abrasive having a particle size of several tens to hundreds nm is known as the polishing abrasive, the former one is usually put on the market as an abrasive for CMP of a metal.

As the oxidizing substance, hydrogen peroxide ($H_2O_2$), ferric nitrate ($Fe(NO_3)_3$) and potassium iodate ($KIO_3$) are usually employed. They are, for example, disclosed in pages 299 to 300 of the above-described "Science of CMP".

Among them, hydrogen peroxide has come to be employed frequently in recent years, because it is free of a metal ion.

The formation of an inlaid interconnect or plug by using a conventional polishing liquid composed mainly of a polishing abrasive for CMP of a metal is however accompanied with the following problems (1) to (7):

(1) generation of dishing (a recess of a metallization member) or erosion (wear at the portion of an insulating film),
(2) generation of scratches (by polishing), (3) occurrence of delamination, (4) necessity of abrasive removal by post-CMP cleaning, (5) a high cost of the polishing liquid, (6) a high cost relating to a polishing agent feeder and equipment for waste liquid disposal, and (7) dust in a clean room from a CMP apparatus.

The above-described problems result from CMP with an abrasive-containing polishing agent. In the conventional CMP method, however, a polishing abrasive is necessary for bringing about mechanical removing effects, thereby promptly removing the oxidized layer formed by an oxidizer and a practical polishing velocity is not available without the addition of a polishing abrasive.

The present applicants studied a method for fabricating an inlaid interconnect structure by polishing a metal film with an abrasive-free polishing liquid, which is disclosed in Japanese Patent Application Laid-Open No. Hei 11-135466. This method makes it possible to fabricate an inlaid metal interconnect structure by subjecting the surface of a metal film to mechanical friction with a polishing liquid containing an oxidizing substance, a substance which solubilizes the thus-oxidized substance in water and water and optionally an anticorrosive substance. For example, a Cu interconnect is formed by using an abrasive-free polishing liquid containing aqueous hydrogen peroxide, citric acid and benzotriazole (which will hereinafter be abbreviated as "BTA").

Although the above-described problems (1) to (7) can be overcome by the use of the above-described abrasive-free polishing liquid, a removal rate of a metal such as Cu under the ordinary polishing conditions is 80 to 150 nm/min. Even if a down force as high as 300 g/cm² or greater is applied, the removal rate is saturated and does not exceed 200 nm/min. Thus, there still remains a problem that a throughput cannot be improved further. A commercially available alumina-abrasive slurry attains a removal rate of 200 to 400 nm/min when a high down force is applied, but in this case, problems such as scratches or delamination becomes more serious.

Some official gazettes relating to the present invention have so far been published and an aqueous phosphoric acid solution is disclosed (in Example 4) in Japanese Patent Application Laid-Open No. Hei 7-94455 as one of abrasive-containing polishing liquids for Cu. According to it, a removal rate ratio of Cu relative to an insulating film can be increased even to 14.5 by using an abrasive-containing polishing liquid containing phosphoric acid in an amount of 3% (FIG. 5 of the above-described official gazette; when Cu is 100%).

Based on the experiment made by the present inventors, however, the removal rate exceeding 50 nm/min was not available only by combination of an abrasive and an aqueous phosphoric acid solution under the practical polishing conditions (under a down force of 500 g/cm² or less at a platen rotational speed of 90 rpm or less). After the elimination of the abrasive, the removal rate was 20 nm/min or less. The results of the experiment suggest that the above-described abrasive-containing polishing liquid had a high removal rate ratio but could not attain highly-precise polishing (for example, free from erosion) in a sufficiently high throughput.

The polishing liquid disclosed by the present invention, on the other hand, has a removal rate as high as 500 nm/min or greater, which is superior by at least one figure to the above-described one.

Also in an abrasive-containing polishing liquid for CMP of tungsten, which is disclosed in Japanese Patent Application Laid-Open No. Hei 10-265766, phosphoric acid or an organic acid is employed as a stabilizer. In this case, the stabilizer serves as a chemical which suppresses the reaction of a catalyst (ferric nitrate) with an oxidizer (hydrogen peroxide) to be added to the polishing liquid.

According to the experiment by the present inventors, the above-described polishing liquid had a Cu etching rate of 100 nm/min or greater and could polish a Cu film, but an Cu interconnect disappeared by etching, suggesting that the polishing liquid was unsuited for CMP of Cu. The idea of the present invention to increase a removal rate of Cu by the addition of phosphoric acid to an abrasive-free polishing liquid does not come from this patent gazette.

In Japanese Patent Application Laid-Open No. Hei 11-21546, a polishing liquid for CMP of Cu is disclosed. The polishing liquid comprises a polishing abrasive, an oxidizer (ex. urea-aqueous hydrogen peroxide) and a complex-forming agent (ex. ammonium oxalate), a protection-layer forming agent (BTA) and a surfactant.

In the column [0025] or [0034] of the official gazette, described is the addition of an inorganic acid such as sulfuric acid, phosphoric acid or nitric acid in order to promote a removal rate of a barrier metal layer such as titanium or tantalum or to adjust the pH of the polishing liquid. The surfactant as described-in it serves to suppress sedimentation, coagulation or decomposition of the polishing abrasive. According to the experiment by the present inventors, it was substantially difficult to polish a Cu film with the above-described polishing liquid if it did not contain the polishing abrasive. In other words, the polishing liquid described in the above patent gazette removes a Cu oxide by making use of the mechanical removing action of the abrasive as essential action. From this patent gazette, the invention of adding a surfactant or thickener to an abrasive-free polishing liquid cannot be anticipated.

A polishing liquid not containing a free abrasive is disclosed in Japanese Patent Application Laid-Open No. Sho 52-21222 as a chemical polishing liquid for copper ornaments such as camera parts. The polishing liquid is made of a surfactant, hydrogen peroxide, sulfuric acid and phosphoric acid. The abrasive is incorporated in order to impart the copper surface with luster by polishing with an emery paper having an abrasive attached thereto. The surfactant is effective for imparting the polished surface with luster by improving the wetness on it. According to the experiment by the present inventors, however, this polishing liquid has an etching rate of 1000 nm/min or greater so that it is not suited as a polishing liquid for the fabrication of an inlaid Cu interconnect of several hundreds nm level.

The polishing liquid of the present invention is required to have a Cu etching rate of 10 nm/min or less because of the following reason. The thickness of the metallization layer of a semiconductor device to which the polishing liquid of the present invention is to be applied is usually 300 nm to 1000 nm. Considering that it takes several minutes for polishing, use of a polishing liquid having, for example, an etching rate of about 100 nm/min may etch Cu of the metallization portion even to the depth of several hundreds nm. In short, the depth of the dishing may reach several hundreds nm. In order to suppress the dishing depth to several tens rim or less, the etching rate by a polishing liquid must be decreased to 10 nm or less. The etching rate is preferably reduced to 1 nm/min or less in consideration of the over polishing time.

In Japanese Patent Application Laid-Open Nos. Sho 55-47382 and Hei 6-57455, an abrasive-free polishing solution is disclosed. In the former one, described is a chemical polishing liquid which is used for deflashing of an aluminum-made machined product and comprises an acid (including a phosphoric acid) and an aromatic Al chelate agent and optionally, a surfactant and hydrogen peroxide. In the latter one, described is a chemical polishing solution which is used for pretreatment of bronze plating and comprises hydrogen peroxide, oxyquinoline, a complex-forming agent and a surfactant, and optionally a phosphoric acid or sulfuric acid which serves to adjust luster or satin. The surfactant is added to improve wetness and prevent generation of mist due to foaming. Either one has an etching rate of 100 nm/min or greater and polishes by its etching action (without friction). Accordingly, it is not suited as a polishing liquid for the fabrication of an inlaid Cu interconnect of the present invention. In addition, the polishing liquid for the inlaid interconnect of LSI which is the object of the present invention is required to attain flatness of a nanometer level, higher than the level of flatness (luster) attained by the polishing liquids described in the above official gazettes.

SUMMARY OF THE INVENTION

With the foregoing in view, the present invention has been completed. An object of the present invention is to provide a novel polishing method capable of overcoming the above-described problems (1) to (7) in the polishing step for forming an inlaid metal interconnect or plug such as via.

More specifically, an object of the present invention is to provide an improved polishing method or manufacturing method of a semiconductor device in which an etching rate of metal such as Cu, an alloy composed mainly of Cu or a Cu compound is 10 nm/min or less and which actualizes high speed polishing (500 nm/min or greater).

Compared with CMP by using the conventional polishing liquid, CMP by using a phosphoric-acid-containing polishing liquid of the present invention makes it possible to suppress occurrence of scratches, delamination, dishing or erosion and to carry out polishing at a high removal rate.

BRIEF DESCRIPTION OF THE DRAWINGS

FIG. 9A and FIG. 9B are fragmentary structural views of metallization for illustrating another advantage of the present invention;

DETAILED DESCRIPTION OF THE PREFERRED EMBODIMENTS

Figure 1A:
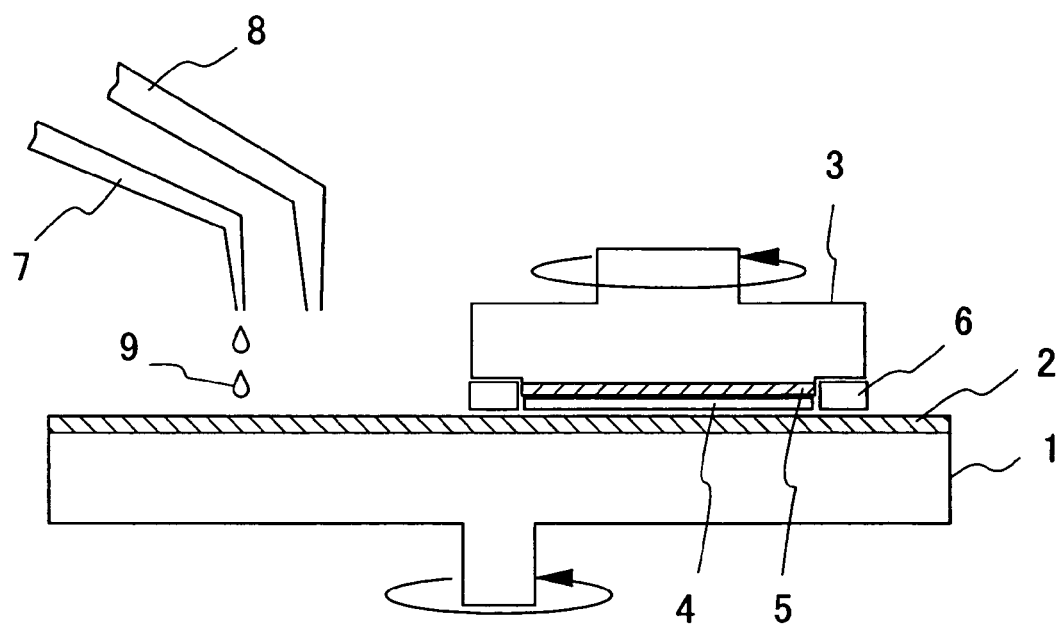
FIG. 1A is a schematic cross-sectional view illustrating a CMP machine.

Among the inventions disclosed by the present application, representative ones will be summarized as follows:

One of the present invention is to remove a metal film such as Cu, an alloy composed mainly of Cu or a Cu compound by chemical mechanical polishing with a polishing liquid containing an oxidizing substance, a phosphoric acid and a protection-layer forming agent.

The phosphoric acid serves to efficiently solubilize, in water, an oxide formed on the surface of a metal film by oxidation by the oxidizing substance. As the phosphoric acid, orthophosphoric acid ($H_3PO_4$) is typical one. In the present invention, orthophosphoric acid is called phosphoric acid unless otherwise specifically indicated.

Examples of the phosphoric acid include, in addition to orthophosphoric acid, phosphorous acid ($H_2PHO_3$), hypophosphorous acid ($HPH_2O_2$), metaphosphoric acid ($HPO_3$), polyphosphoric acid (ex. diphosphoric acid (pyrophosphoric acid)) and phosphoric-acid-containing substances.

Among them, orthophosphoric acid and phosphorous acid have effects for raising a removal rate. Orthophosphoric acid has, in addition, advantages such as excellent chemical stability and lowest cost.

A polishing solution containing phosphorous acid or hypophosphorous acid is more harmless than that containing orthophosphoric acid. Orthophosphoric acid and phosphorus acid are less irritant than hypophosphorous acid or metaphosphoric acid. Phosphorous acid does not cause roughening of the polished surface, compared with orthophosphoric acid.

As a substance suppressing excessive oxidation or etching of a metal film, a protection-layer forming agent is effective. Any protection-layer forming agent can be used insofar as it is, when added to a polishing liquid, effective for lowering an etching rate of a metal to be polished. It can suppress dishing which otherwise appears after metallization processing.

Before addition of a protection-layer forming agent to the polishing liquid of the present invention, the etching rate of a metal film exceeds 50 nm/min, suggesting that the polishing liquid is, in essence, highly corrosive. By the addition of a protection-layer-forming agent, the polishing liquid acquires an anticorrosive effect, whereby the resulting polishing liquid can be employed for CMP. It is preferred to add the protection-film-forming agent so that the etching rate becomes 10 nm/min or less.

As a protection-layer forming agent for Cu or a Cu alloy, BTA (benzotriazole) is a typical one. Examples of the practically usable protection-layer forming agent include, in addition, tolyltriazole (which will hereinafter be abbreviated as "TTA"), BTA derivatives such as and BTA carboxylic acid (which will hereinafter be abbreviated as "BTA-COOH") and quinaldinic acid, of which BTA is accompanied with such advantages as a low cost and high solubility in water (solubility in pure water at room temperature: 2 wt. %).

Addition of an alcohol is remarkably effective for heightening a solubility of the protection-layer forming agent in the polishing liquid. When the temperature of the polishing liquid approaches to about 0° C. or another additive is added, the solubility of the protection-layer forming agent in the polishing liquid becomes less than that in pure water, which happens to cause crystallization and precipitation in the polishing liquid. It is therefore necessary to increase its solubility to at least two times as much as that in pure water at room temperature. For example, when BTA is used as the protection-layer forming agent, addition of methanol in an amount of about 1% to the polishing liquid increases the solubility of BTA by at least two times. Ethanol or isopropyl alcohol has a similar effect.

As another protection-layer forming agent, a surfactant and thickener can be mentioned as examples. These polymers are effective for suppressing etching by adsorbing to the interface of the polishing liquid and a metal during CMP, thereby forming a polymer protection layer. Different from the above-described BTA which selectively adsorbs to Cu, they can be used for a general purpose.

Among these polymers, a carboxyl-containing one is desired for the purpose of improving a metal removal rate. Examples include polyacrylic acid and polymethacrylic acid, and ammonium salts, triethanolamine salt, monoethanolamine salt, triethylamine salt and diisopropanolamine salt thereof.

A polymer having a high molecular weight has a still higher protection-layer forming effect and particularly, a bridged bond type polymer having a high thickening effect is effective for increasing the removal rate further. Examples include bridged bond type polyacrylic acid and salts thereof.

Some surfactant polymers have germicidal or mildew-proofing action. They can heighten polishing properties and at the same time, prevent generation of mold or bacteria in a storage solution before use of the polishing liquid or waste water of it. Examples include cetyl pyridinium chloride.

It is possible to heighten the removal rate by using a mixture of two substances as the protection-layer forming agent compared with the use of them singly. Examples of such combination include that of an anticorrosive and a surfactant and that of an anticorrosive and a thickener, more specifically, that of BTA and polyammonium acrylate, that of BTA and bridged bond type polyammonium acrylate, and that of BTA and cetyl pyridinium chloride.

An antifoaming agent can be added further to prevent foaming upon addition of a surfactant.

An organic acid or salt thereof can also be added to the above-described polishing liquid as needed. The organic acid, similar to a phosphoric acid, serves to efficiently solubilize, in water, a metal to be polished upon ionization thereof (ex. $Cu^{2+}$ ion) Compared with single use of a phosphoric-acid type acid, use of it in combination is effective for improving the uniformity of polishing within a wafer and preventing the roughening of the polished surface.

Among the organic acids, hydroxyl- and/or carboxyl-containing organic acids such as hydroxy acid, hydroxycarboxylic acid, and carboxylic acid are effective for heightening the removal rate.

Examples include organic acids such as citric acid, malic acid, malonic acid, succinic acid, tartaric acid, phthalic acid, maleic acid, fumaric acid, lactic acid, pimelic acid, adipic acid, glutaric acid, oxalic acid, salicylic acid, glycolic acid, tricarballylic acid, benzoic acid, formic acid, acetic acid, propionic acid, butyric acid and valor acid; and salts thereof. In addition, chelating agents such as EDTA (ethylenediaminetetraacetic acid) can be employed.

The salts are effective for heightening a solubility and those free of a metal component, such as ammonium salts, and those containing an element (ex. aluminum) not adversely affecting a semiconductor device are preferred. They may be used in combination.

Among the above-exemplified acids, malonic acid, tartaric acid, malic acid, citric acid, succinic acid, maleic acid, fumaric acid, glycolic acid, tricarballylic acid and lactic acid are preferred as an organic acid to be added to the polishing liquid of the present invention, from the viewpoints of a high removal rate and a low etching rate.

Among the above-exemplified acids, citric acid, malic acid, malonic acid and tartaric acid are generally used as a food additive. Owing to low toxicity, relatively harmless waste water, no odor and high water solubility, they are particularly preferred as an organic acid to be added to the polishing liquid of the present invention.

The oxidizing substance has action of oxidizing the surface of a metal film to be polished. Hydrogen peroxide is most suited because it is free of a metal component. Nitric acid, ferric nitrate or potassium periodate has sufficient oxidizing power so that it can be employed if the metal component contained therein does not cause any hindrance. These oxidizers may be used either singly or in combination.

The polishing liquid of the present invention containing an alumina abrasive or silica abrasive is expected to have an increased effect of a removal rate. Such a polishing liquid however causes the above-described problems (1) to (7), so if such problems do not cause any hindrance, it can be employed. The content of the abrasive differs, depending on the using purpose of the polishing liquid. Dishing and erosion can be suppressed by adding the polishing abrasive in an amount of 0.05 wt. % or less.

Scratches formed on the surface of an insulating film such as $SiO_2$ can be reduced by adding the polishing abrasive in an amount less than 0.5 wt. %.

Scratches formed on the surface of a metal film can be reduced by adding the polishing abrasive in an amount of 0.1 wt. % or less.

Delamination can be suppressed by adding the polishing abrasive in an amount of 0.3 wt. % or less.

Cleaning properties can be improved by adding the polishing abrasive in an amount of 0.01 wt. % or less.

The cost of the polishing liquid car be reduced by adding the polishing abrasive in an amount of 0.001 wt. % or less.

The cost-wise problem of a polishing agent feeder and waste water disposal equipment can be overcome by adding the polishing abrasive in an amount of 0.0001 wt. % or less.

Dust in a clean room can be suppressed by adding no polishing abrasive.

Although a polishing liquid containing an abrasive in an amount not exceeding any one of the above-described trace amount must be defined as "an abrasive-free polishing liquid", a polishing liquid utterly free of an abrasive such as silica or alumina-abrasive or a polishing liquid containing it in an amount of only 0.05 wt. % or less is defined as "a substantially abrasive-free polishing liquid" or "an abrasive-free polishing liquid, because main object of the present invention is to suppress dishing, erosion or scratches.

Upon formation of an inlaid Cu interconnect or a plug such as via, the above-described problems, particularly those of (1) (2), (5) and (6), can be solved largely by polishing in two steps, that is, polishing Cu (first step) by using a substantially abrasive-free polishing liquid and then polishing a barrier metal (second step) by using an abrasive-containing polishing liquid.

The above-described method is accompanied with such an advantage that a barrier metal film can be polished at a high velocity and troubles such as residues of the Cu film or barrier metal film due to the existence of a recess in the underlying film can be avoided.

The polishing liquids can be fed separately to a polishing platen for Cu and that for a barrier metal, but it is convenient to feed an abrasive-free polishing liquid to both platens, followed by additional feeding of an abrasive dispersion to the polishing platen for a barrier metal. Thus, the use of two polishing liquids which are similar in composition except for the presence of an abrasive facilitates the storage of these polishing liquids and management of their properties or performance.

A fixed-abrasive-type polishing pad or whetstone can be used. Use of it permits reduction of an abrasive component in the polishing waste, making it easy to solve the problem of waste water disposal in (6) When a whetstone is used, flatness is improved even if the polishing is started from Cu, which contributes to the solution of the above-described problem (1).

Upon the above-described polishing in two steps, it is possible to use two polishing liquids different in composition, respectively. In order to positively suppress erosion or dishing, thereby bringing about the highest effect by lowering the removal rate of Cu in the second step, the concentration of the protection-layer forming agent in the polishing liquid is heightened in the second step to increase the removal rate of a barrier metal film relative to that of Cu. For example, the barrier metal/Cu selectivity can be heightened by at least two times by increasing the concentration of BTA and/or polymer. Even without addition to the polishing liquid, similar effects are available by letting an aqueous BTA having a high concentration (about 1%), together with a polishing liquid, to flow on a platen.

Metallization may be conducted using the first polishing step and dry etching in combination instead of the above-described two-step polishing. Described specifically, abrasive-free CMP of Cu is conducted as a first step, followed by removal of a barrier metal film by dry etching without a polishing liquid as a second step, whereby the polishing can be conducted by a complete-abrasive-free process and the above-described problems (1) to (7) can be solved.

Sulfur hexafluoride ($SF_6$) is most suited as a gas used for dry etching of a barrier metal, because $SF_6$ emitting many F radicals by plasma dissociation is useful for the selective removal of TiN or TaN and it has low reactivity with Cu. The Cu/barrier metal etching selectivity is preferably 3 or greater, and for widening the margin of a dry etching process, it is preferably 5 or greater.

The polishing liquid according to the present invention can be applied to a metal film such as Cu, Ti, TiN, Ta or TaN. The removal rate of Cu, which embraces an alloy composed mainly of Cu or a Cu compound, is high when a substantially abrasive-free polishing liquid is used so that it is most suited as a metal to be polished in the present invention. The removal rate of Ti, TiN, Ta or TaN when an abrasive-free polishing liquid is employed is not so high as that of Cu, but an abrasive-containing polishing liquid permits the use of such a film.

When CMP of Cu is, for example, conducted with a polishing liquid composed of an oxidizing substance, a phosphoric acid and a protection-layer forming agent, the surface of the Cu film is first protected by the protection-layer forming agent. The protruded region on the surface of the Cu film is subjected to ceaseless mechanical friction with a polishing pad so that the protection layer formed by the protection-layer forming agent is removed easily.

The surface of the Cu film exposed to the polishing liquid is oxidized by the oxidizing substance and a thin oxide layer is formed on the surface.

Supply of a phosphoric acid causes elution of the oxide layer as an aqueous solution, leading to a decrease in the thickness of the oxide layer. The thinned portion of the oxide layer is then exposed again to the oxidizing substance and becomes thick. CMP makes progress, while repeating this reaction.

The reaction product at the protruded region on the surface of the Cu film tends to be removed and the reaction is accelerated by partial heating. The above-described repeated reactions of oxidation and water solubilization proceed faster at the protruded region than the recessed region. In other words, the removal rate increases at the protruded region, whereby planarization is attained.

The above-described protecting-layer forming agent adheres to the surface of the metal film and suppresses the reaction at the recessed region, finally bringing about an effect for preventing occurrence of dishing. A protection-layer forming agent usually employed as an anticorrosive, such as a BTA derivative, forms a markedly strong protection layer on the surface of a Cu film. A polymer having an interface activating effect such as polyacrylic acid exhibits an effect as an anticorrosive by forming a polymer film on the interface between the polishing liquid and Cu surface.

An amount of the protection-layer forming agent to be added to the polishing liquid is preferably adjusted so that the removal rate is maintained at 500 nm/min or greater and the etching rate is suppressed to 10 nm/min or less (a rate ratio: at least 50), with the etching rate of 1 nm/min or less (a rate ratio: at least 500) being more preferred. Addition of the agent in an amount exceeding the above range happens to lower the CMP rate. At amounts less than the above-described range, the etching rate increases and although it does not disturb CMP, dishing tends to occur.

The present invention makes it possible to adjust such polishing properties easily and largely contributes to the actualization of an LSI or electronic circuit device having minute multilevel interconnects markedly different in electrode wiring density.

The present invention will be described specifically based on the accompanying drawings.

(Embodiment 1)

In this Embodiment, a method to form a Cu interconnect by CMP of Cu will be described.

FIG. 1A is a schematic cross-sectional view illustrating the main portion of a CMP machine used in this Embodiment. A holder 3 having a semiconductor wafer 4 supported, in the reversed form, by a backing pad 5 is disposed above a platen 1 having a polishing pad 2 fixed thereto and CMP is conducted by the rotation of the platen 1 and holder 3.

The holder 3 is equipped with a retainer ring 6 so as to prevent the semiconductor wafer 4 from being slipped out during CMP. A down force during CMP is adjusted by a load applied to the upper portion of the holder 3. The standard down force, rotational frequency of the platen and the rotational frequency of the holder are adjusted to 220 g/cm$^2$, 60 rpm and 20 rpm, respectively, but not limited thereto. As the polishing pad 2, a hard polishing pad IC1000 of Rodel is employed. The polishing pad 2 having grooves formed thereon may be employed as needed.

Figure 2:
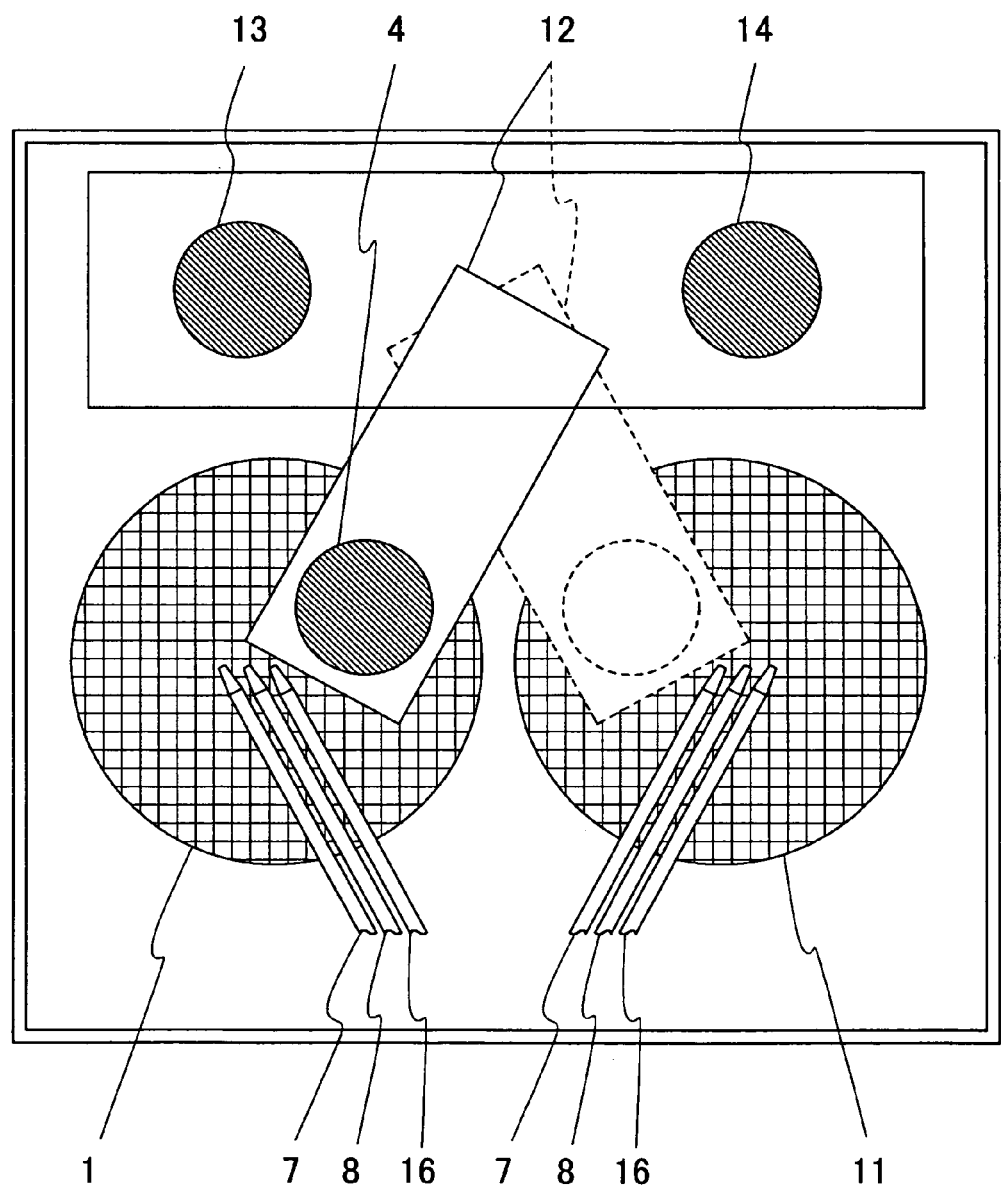
FIG. 2 is a schematic plan view illustrating the CMP machine.

FIG. 2 is a plan view of the main part of this CMP machine as viewed downward. Two platens have the same structure and a first platen 1 is for polishing of Cu, while a second platen 11 is for polishing of a barrier metal. Each of these platens have a polishing pad 2 as illustrated in FIG. 1A. Continuous polishing (two-step polishing) can be conducted by transporting the wafer 4 between these two platens 1 and 11 by a transporting mechanism 12. For simplification, the holder 3 is not illustrated. Indicated at numerals 13 and 14 are a wafer loader and a wafer unloader, respectively. The CMP machine may have a third platen (not illustrated) for buff polishing in addition to these two platens.

CMP is carried out by dripping the polishing liquid 9 of the present invention at a rate of about 200 cc/min from a first liquid feed opening 7 disposed above the plate 1 as illustrated in FIG. 1A onto the polishing pad 2. After completion of CMP, the first liquid feed opening 7 is closed to terminate the feeding of the polishing liquid 9, while pure water is supplied from a second liquid feed opening 8 at a rate of about 3000 cc/min, followed by rinsing for 30 to 60 seconds. CMP is carried out at room temperature.

Then, the wafer is maintained under the conditions not permitting drying. After removal of the polishing liquid by brush scrub cleaning, the wafer is dried by a rinser drier, spinner or the like.

Figure 1B:
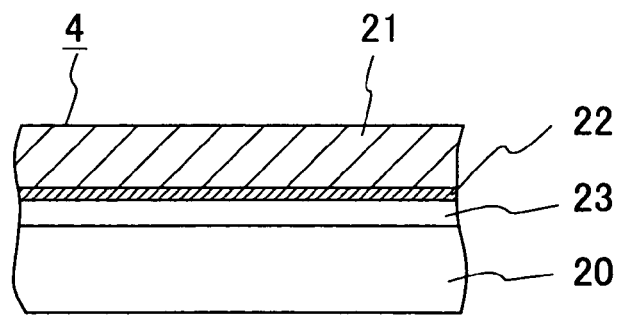
FIG. 1B is a cross-sectional view of a sample wafer to be polished.

First, fundamental polishing properties of the polishing liquid of the present invention were studied using a flat semiconductor wafer having no metallization pattern formed thereon. A sample wafer was obtained as illustrated in the cross-sectional view of FIG. 1B by forming a silicon oxide film 23 of 200 nm thick over a flat silicon semiconductor substrate 20 and then continuously forming a TiN film (barrier metal film) 22 of 50 nm thick as an adhesive layer and a Cu film 21 of 2000 nm thick by sputtering. The wafer 4 has a diameter of 5 inches.

The polishing liquid used in this Embodiment is an aqueous solution containing aqueous hydrogen peroxide (a commercially-available 30 wt. % aqueous $H_2O_2$ solution), orthophosphoric acid (which will hereinafter be called "phosphoric acid", simply), BTA and methanol and it is a so-called abrasive-free polishing liquid which is substantially free of a polishing abrasive such as alumina or silica. It is made of 30 wt. % of aqueous hydrogen peroxide, 0.2 wt. % of phosphoric acid, 0.2 wt. % of BTA and 1 wt. % of methanol. The removal rate and etching rate of the Cu film 21 were measured using the above-described phosphoric-acid-type abrasive-free polishing liquid. The removal rate and etching rate were determined by converting a change in the electric resistance of the Cu film 21. The polishing was conducted for 2 minutes.

As a result, the removal rate of the Cu film 21 was 550 nm/min and the etching rate was controlled to 1.0 nm/min or less, suggesting that no dishing problem occurs. The removal rate of the SiO$_2$ film 23 was 0.1 nm/min or less, suggesting that no erosion problem occurs. As understood from the above-described test, the polishing liquid used in this Embodiment has a removal rate about 5 times as much as that of the conventional organic-acid-type abrasive-free polishing liquid (for example, made of 30 wt. % of aqueous hydrogen peroxide, 0.15 wt. % of citric acid and 0.2 wt. % of BTA) disclosed in the above-described Japanese Patent Application Laid-Open No. Hei 11-135466.

When the above-described polishing liquid was free of a phosphoric acid or aqueous hydrogen peroxide, the Cu film 21 was hardly polished therewith (removal rate of 50 nm/min or less) When BTA was not added, the Cu film 21 was polished at a removal rate of about 200 nm/min, but the etching rate became as high as 100 nm/min, suggesting that such a polishing liquid was not suited for the formation of an inlaid interconnect.

After removal of the Cu film 21 by the above-described polishing to expose the barrier metal film 22, TiN as the barrier metal was polished with a polishing liquid obtained by adding 1 wt. % of a silica abrasive to the above-described polishing liquid. A test was conducted by a method similar to the above-described polishing method for the Cu film 21. As a result, the TiN film 22 was polished at a removal rate of 100 nm/min. The $SiO_2$ film 23 was, on the other hand, polished at a removal rate of 1 nm/min or less.

In the above-described fundamental test, TiN was employed as a barrier metal. Ta and TaN were tested in a similar manner while changing the polishing time, resulting in the removal rates of 40 nm/min and 50 nm/min, respectively.

Polishing liquids were prepared using, instead of the phosphoric acid, phosphorous acid, hypophosphorous acid and metaphosphoric acid and the removal rate of Cu was measured in a similar manner to the above method, resulting in 550 nm/min, 520 nm/min and 500 nm/min, respectively. In each case, the etching rate was controlled to 1.0 nm/min or less, suggesting that no dishing problem occurs.

From the microscopic observation of the polished surface, it has been proved that compared with phosphoric acid, phosphorous acid is effective for suppressing roughening of the polished surface. In either one, TiN was polished at a removal rate of 100 nm/min, while Ta and TaN were polished at a removal rate of 40 nm/min and 50 nm/min, respectively. $SiO_2$ was polished at a removal rate of 0.1 nm/min, suggesting that no erosion problem occurs.

In the next place, an example of forming an inlaid interconnect and an inlaid plug by using the phosphoric-acid-type polishing liquid of the present invention will be described. They can also be formed in a similar manner by using another phosphoric acid type (ex. phosphorous acid, hypophosphorous acid or metaphosphoric acid) polishing liquid.

Figure 3A:
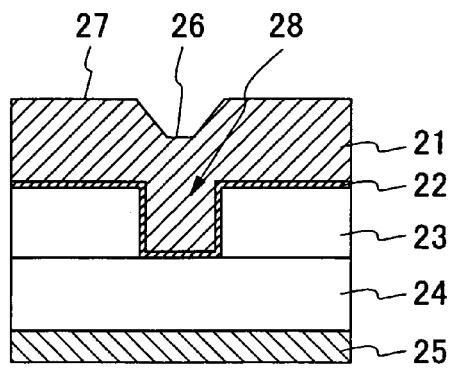
FIG. 3A to FIG. 3E are fragmentary structural views of metallization for illustrating the step of CMP.

FIG. 3A illustrates the cross-sectional structure of a semiconductor wafer before polishing. Over a silicon substrate 25 having an impurity-doped layer or insulating film (not illustrated) formed thereon, a BPSG film (a silicon oxide film having boron and phosphorous added thereto) 24 of 500 nm thick and a silicon oxide film 23 of 500 nm thick were formed, followed by the formation of a groove pattern 28 for an interconnect of 500 nm deep in the silicon oxide film 23 by lithography and dry etching.

After formation of a TiN layer 22 of 50 nm thick as an adhesion layer (barrier metal layer) over the bottom and side surface of the groove 28 and the surface of the silicon oxide film 23, a Cu thin film 21 of 800 nm thick was continuously formed by sputtering. For the improvement of step coverage, vacuum heat treatment was conducted at 450° C. for 3 minutes in a sputtering apparatus.

On the surface portion of the silicon substrate 25, an impurity-doped semiconductor region, such as source and drain, a gate insulating film and a gate electrode are formed and constitute MISFET, but they are not illustrated for simplification as described above.

Figure 3B:
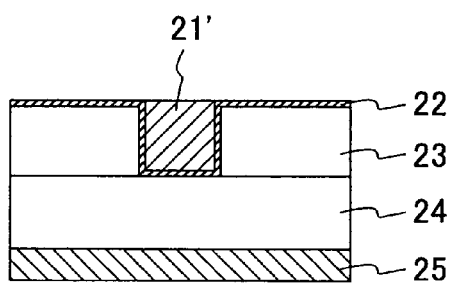

The sample wafer 4 was subjected to CMP on the first platen 1 of FIG. 2 by using the above-described phosphoric-acid-type abrasive-free polishing liquid, resulting in the removal of the upper Cu film 21 by polishing. As illustrated in the cross-sectional view of FIG. 3B and the plan view of FIG. 3C, a substantially flat surface shape with a dishing or erosion of about 50 nm or less was available. The time necessary for completing polishing was about the one-fourth of that of the conventional organic acid type abrasive-free polishing liquid. Neither delamination nor scratches occurred. The cross-sectional view FIG. 3B illustrates a cross-section taken along line B—B of the plan view FIG. 3C.

Then, the TiN film 22 left over the insulating film ($SiO_2$ film) 23 was polished on the second platen 11 of FIG. 2 by using a polishing liquid obtained by adding 1 wt. % of a silica abrasive to the above-described phosphoric acid type polishing liquid. Polishing was conducted for 40 seconds. As a result, the TiN film 22 on the insulating film was removed and an inlaid interconnect layer 21' having a substantially flat surface with dishing or erosion of about 50 nm or less was formed as illustrated in the cross-sectional view of FIG. 3D and the plan view of FIG. 3E. The cross-sectional view FIG. 3D illustrates a cross-section taken along line D—D of the plain view FIG. 3E.

When Cu and barrier metal were polished by using one platen, erosion appeared upon abrasive-free polishing owing to the abrasive remaining in the polishing pad 2, indicating that it is necessary to prepare a platen and pad exclusively used for abrasive-free CMP.

Figure 4A:
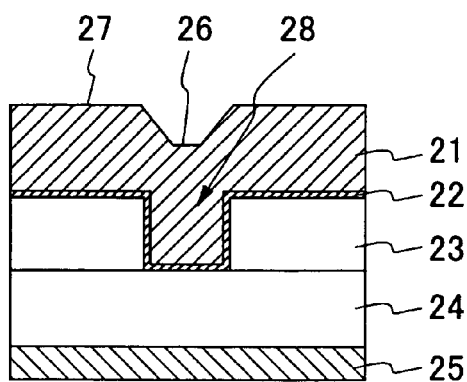
FIG. 4A to FIG. 4E are fragmentary structural views of another metallization for illustrating the step of CMP.
Figure 4B:
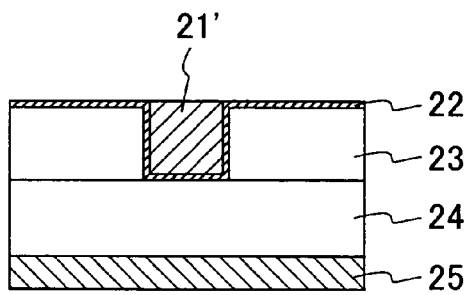
Figure 4C:
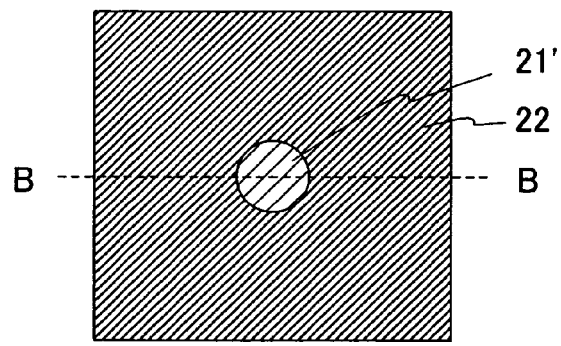
Figure 4D:
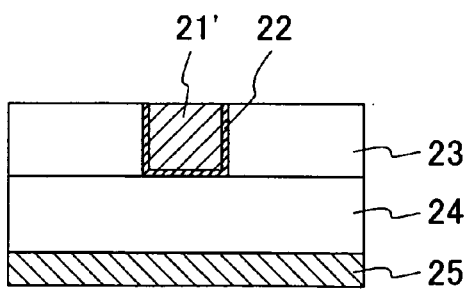
Figure 4E:
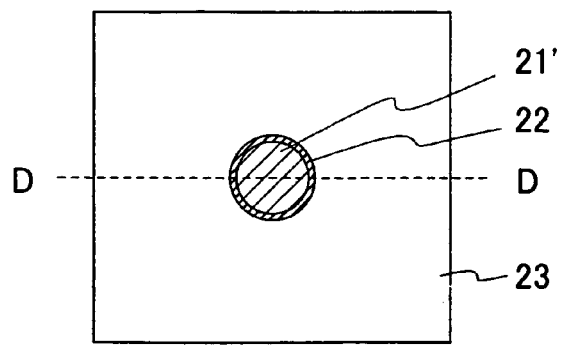

A wafer sample having a cross-section as illustrated in FIG. 4A was subjected to CMP by two steps in a similar manner to that used for the formation of the above-described inlaid interconnect, whereby an inlaid plug structure (21') of Cu surrounded by an insulating film such as $SiO_2$ was formed as illustrated in the cross-sectional view of FIG. 4D and the plan view of FIG. 4E.

Figure 3C:
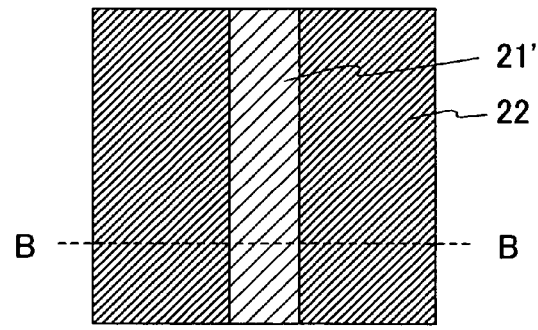
Figure 3D:
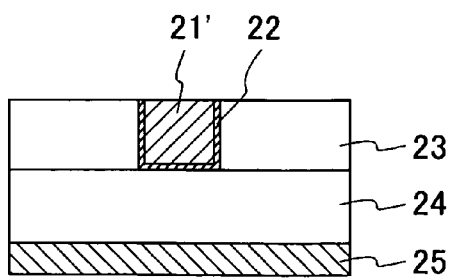

The barrier metal remaining in the groove after CMP of the Cu film 21 was illustrated in FIGS. 4B and 4C as in FIGS. 3B and 3C. In any stage, dishing or erosion was controlled to about 50 nm or less. Neither delamination nor scratches occurred. A Cu film for the formation of a plug was formed by electroplating in order to improve the embedding property of Cu in a hole 28.

The concentration of BTA in the above-described polishing liquid used for polishing of the barrier metal was 0.2 wt. %, which was equal to that of the polishing liquid used for Cu polishing.

In order to reduce the removal rate of Cu and suppress dishing by a polishing liquid for a barrier metal, heightening of the BTA concentration in the polishing liquid for a barrier metal is effective. For example, an increase of the BTA concentration to 0.5 wt. % upon polishing of a barrier metal reduces the removal rate of Cu by about half. The concentration of BTA can be increased by two methods: one is to preliminarily add this concentration of BTA to a polishing liquid for a barrier metal and the other one is to additionally supply, for example, 1% aqueous BTA upon supply the platen 11 with the Cu polishing liquid. Indicated at numeral 16 in FIG. 2 is a liquid feed pipe permitting such composition adjustment of a polishing liquid.

The electric resistance of the inlaid Cu interconnect 21' formed in FIG. 3D was measured, resulting in 1.9 micro-ohm-cm which includes the value of the TiN layer. The open/short failure test using a zigzag interconnect (interconnect width: 0.3 micro meter to 3 micro meter, length: 40 mm) or comb-like interconnect (distance between interconnects: 0.3 micro meter to 3 micro meter, length: 40 mm) was conducted, resulting in a yield of about 100%.

Figure 5A:
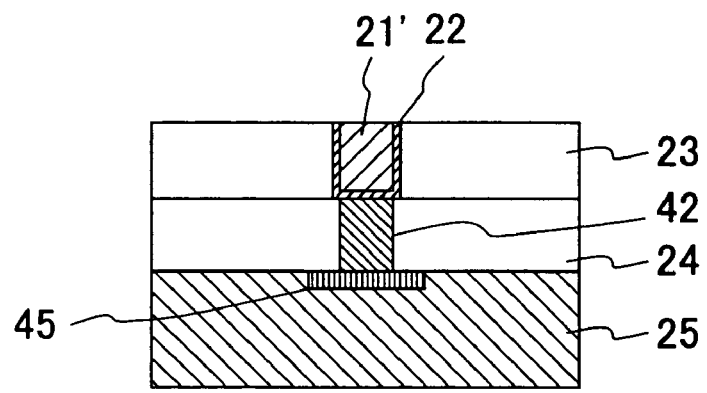
FIG. 5A and FIG. 5B are fragmentary structural views illustrating metallization formed by CMP.

As illustrated in the cross-sectional view of FIG. 5A, a Cu plug 21' was added as illustrated in FIGS. 4A through 4E to a semiconductor substrate having a tungsten-made plug 42 which is embedded in an insulating layer 24 and extends from an impurity-doped semiconductor layer 45. As a result, it has been found that normal conduction was available through the tungsten plug 42 and the performance as an LSI was also normal. The insulating film 23 forming the uppermost layer and the interconnect plug 21' embedded therein were each found to have a substantially flat main surface with dishing or erosion suppressed to 50 nm or less, thus exhibiting good flatness.

Figure 5B:
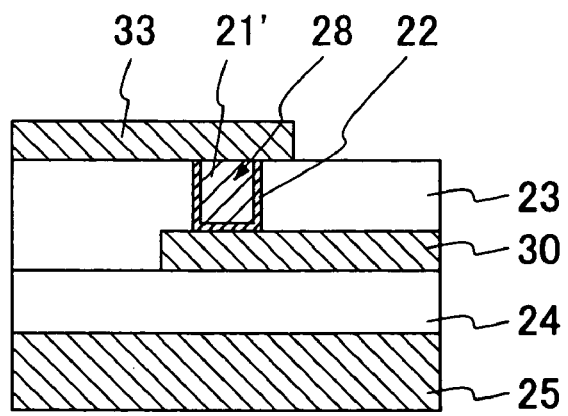

As described later in detail, the present invention is particularly useful for the formation of a multilevel metallization structure as illustrated in FIG. 5B, more specifically, a structure obtained by disposing a first interconnect layer 30 over a first insulating layer 24 on a substrate 25, depositing thereover a second insulating layer 23, forming a groove 28 which passes through the insulating layer 23, allowing a barrier metal film 22 and a Cu film 21 to adhere to the inner surface of the groove 28 and the surface of the insulating film 23, removing the metal films 21 and 22 over the insulating film 23 by the above-described CMP technique of the present invention, thereby forming an inlaid interconnect or plug 21' and then, forming a second interconnect layer 33 having a predetermined pattern by the usual method. The second interconnect layer was allowed to adhere all over the surface of the insulating layer 23 by sputtering or deposition technique and a predetermined minute pattern is formed on it by photographic treatment or dry etching. The flatness of the surfaces of the insulating film 23 and interconnect layer 33 is considerably important in focusing or alignment upon formation of the pattern and the present invention largely contributes to it.

When the Cu inlaid interconnect or plug 21 is formed making use of the CMP technique of the present invention as illustrated in FIG. 5B, a thin protection layer is formed on the Cu surface by the above-described protection-layer forming agent in the polishing liquid. For improving the electric connecting properties with the second interconnect layer, it is important to remove the protection layer by treating the Cu surface with plasma of a reducing atmosphere such as ammonia plasma prior to adhesion of the second interconnect layer. The details of the plasma treatment are as described in Japanese Patent Application Laid-Open No. Hei 11-226876 for which the present applicants have already applied for a patent. They are not explained in detail herein. The plasma treatment was applied to the below-described examples, but a detailed description was omitted to avoid repetition.

Figure 3E:
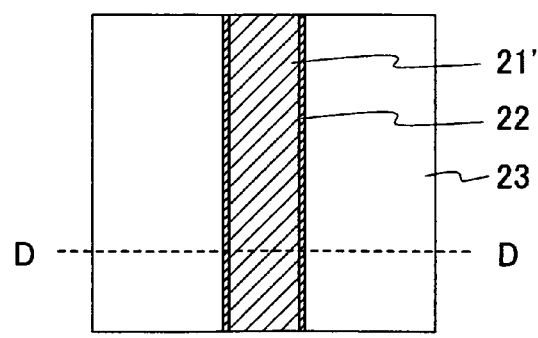
Figure 6A:
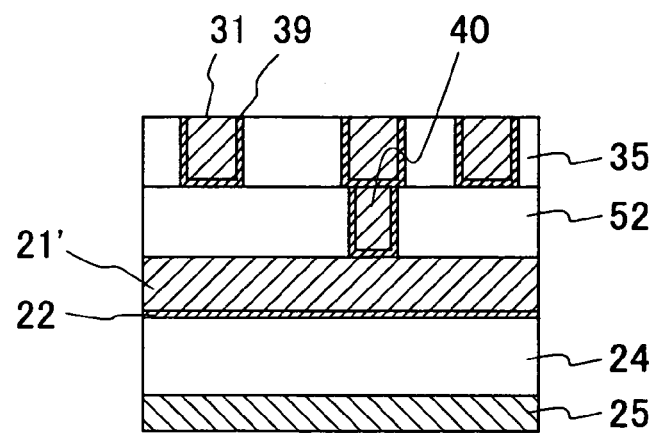
FIG. 6A and FIG. 6B are fragmentary structural views illustrating another metallization formed by CMP.
Figure 6B:
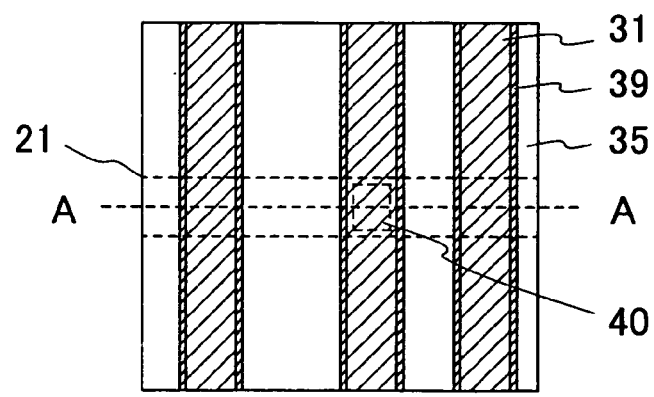

A multilevel metallization structure as shown in FIGS. 6A and 6B was fabricated by repeating a manufacturing step of the inlaid interconnect structure of FIGS. 3D and 3E and that of an inlaid plug structure of FIGS. 4D and 4E. FIG. 6B is a plan view and FIG. 6A is a cross-sectional view taken along line A—A of FIG. 6B. Indicated at numeral 31 is an inlaid Cu interconnect. It has been confirmed that the conduction yield of the plug 40 was almost 100% and performance as LSI was normal. Similar conduction was available even if tungsten was employed instead of Cu as a material for the plug 40.

Formation of a tungsten film by CVD is advantageous from the viewpoint of embedding properties and an adhesion metal film such as TiN or Ti can be omitted.

Figure 7A:
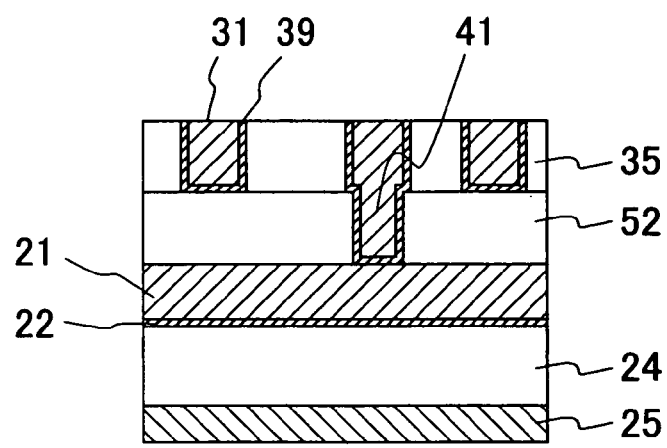
FIG. 7A and FIG. 7B are fragmentary structural views of further metallization formed by CMP.
Figure 7B:
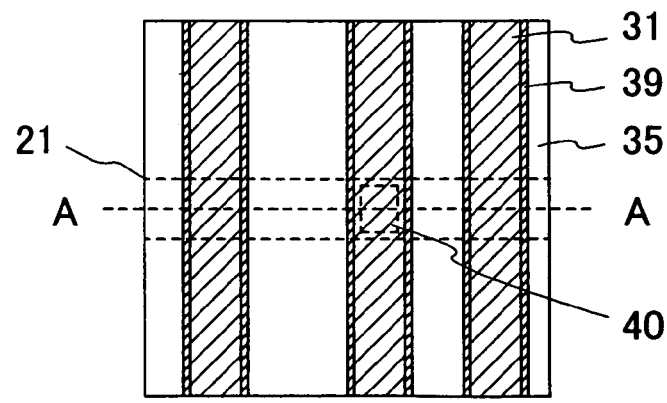

As illustrated in FIG. 7, a plug 41 was formed by the dual damascene method, which permitted a decrease in the step number for multilevel metallization. It has been confirmed that in this method, the performance as LSI was normal. FIG. 7B is a plan view, while FIG. 7A is a cross-sectional view taken along line A—A of FIG. 7B.

It has also been confirmed that in the multilevel metallization structure fabricated in FIGS. 6A and 6B or FIGS. 7A and 7B, the insulating film 35 forming the uppermost layer and the interconnect layer 21' embedded therein exhibited a substantially flat common main surface with a dishing or erosion suppressed to 50 nm or less.

Multilevel metallization of an LSI having at least three interconnect layers was obtained making use of the metallization method and plug forming method as illustrated in. FIGS. 6A and 6B, and FIGS. 7A and 7B. In particular, the advantage of the present invention has been confirmed by applying it to a system LSI having, on one semiconductor chip, multilevel interconnects widely different in the electrode density among regions.

A description will next be made of the advantage of the present invention brought by the application of it to such a system LSI.

Figure 8A:
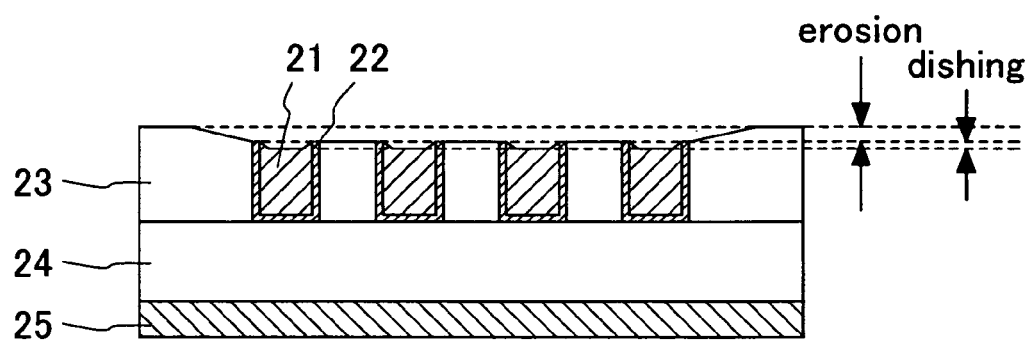
FIG. 8A and FIG. 8B are fragmentary structural views of metallization for illustrating an advantage of the present invention.

FIG. 8A is a fragmentary cross-sectional view of an interconnect formed by CMP using the conventional polishing liquid and method not free from occurrence of erosion or dishing. On the surface of the interconnect portion, a recess due to partial etching of the insulating film 23 such as $SiO_2$, that is, erosion appears and a recess due to partial falling of the metal portion 21 such as Cu, that is dishing, appears.

Figure 8B:
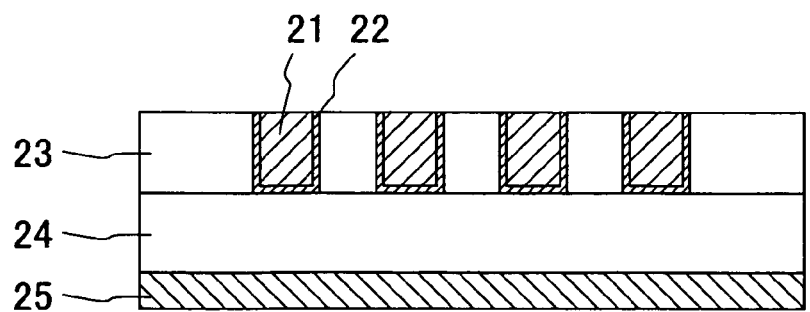

In the present invention, on the other hand, it is possible to form, as illustrated in FIG. 8B, an insulating film 23 having an interconnect member embedded therein and the interconnect member to have a substantially flat surface with erosion or dishing controlled to 50 nm or less, which brings about a large advantage for multilevel metallization.

A description will next be made of, based on FIGS. 9A and 9B, a difference in multilevel metallization between the conventional CMP technique and CMP using the polishing liquid and polishing method according to the present invention. In FIGS. 9A and 9B, a metal interconnect member or plug embedded in an interlayer dielectric layer is mainly illustrated and a plurality of multilevel interconnects connected therewith are omitted for simplification, but the structure of them is apparent from FIG. 1B and the description thereon.

FIG. 9A including steps (1) to (5) are enlarged fragmentary cross-sectional views illustrating, in the order of steps, multilevel metallization formed by CMP using the conventional polishing liquid. In the step (1) of FIG. 9A, indicated at numeral 21 is a plug such as Cu embedded in the insulating film 23. As illustrated in the step (2) of FIG. 9A, an interconnect 52 having a predetermined pattern is disposed over the insulating film 23 as the second layer, followed by the formation thereover an interlayer dielectric film 53 as the third layer. As illustrated in the step (3) of FIG. 9A, a groove is formed in the interlayer dielectric film 53 and then a metal film 54 such as Cu is formed over the interlayer dielectric film 53 to embed the groove with the metal film 54. As illustrated in the step (4) of FIG. 9A, the metal film 54 is subjected to second CMP. The metal film 54 remains in a recess (erosion or dishing) 47 formed by the CMP step of (1), so that an inlaid interconnect member or plug 54 of the second layer is formed by continuously and excessively conducting CMP for the removal of the metal film, whereby a multilevel metallization-structure having a recess 48 deeper than the recess 47 is formed.

Thus, CMP by the conventional polishing liquid was accompanied with the problem that after polishing, the residue appeared on the upper layer owing to the influence of dishing or erosion formed in the underlying layer. Over-CMP time excessively conducted for the removal of the residue as illustrated in the step (4) of FIG. 9A increases on the upper layer, which accelerates dishing or erosion. As illustrated in the step (5) of FIG. 9A, dishing or erosion increased by the excessive CMP on the upper layer.

When the number of interconnect layers become 3 or greater, the residue increases further and when complete removal of it is tried, erosion causes disappearance of more than half of the interconnects themselves at the densely disposed part. By the conventional polishing method, therefore, it was impossible to suppress dishing or erosion to 50 nm or less and moreover, to suppress it to 100 nm or less when 7 interconnect layers were formed.

FIG. 9B including steps (1) to (5) are fragmentary cross-sectional views illustrating, in the order of steps, the formation of multilevel metallization by CMP using the polishing method of the present invention. In the step (1) of FIG. 9B, indicated at numeral 21 is a metal interconnect member or plug such as Cu embedded by CMP in the insulating film 23 of the second layer and it is connected with the underlying first interconnect layer 51 on the first insulating layer 50. As illustrated in the step (2) of FIG. 9B, an interconnect layer 52 having a predetermined pattern is disposed over the insulating film 23 as the second layer, followed by the formation thereover an interlayer dielectric film 53 as the third layer. As illustrated in the step (3) of FIG. 9B, a groove is formed in the interlayer dielectric film 53 and then a metal film 54 such as Cu is formed over the interlayer dielectric film 53 to embed the groove with the metal film 54. As illustrated in the step (4) of FIG. 9B, the metal film 54 is subjected to second CMP. Then, as illustrated in the step (5) of FIG. 9B, a third interconnect layer 55 is formed over the third dielectric layer 53 and second interconnect member or plug 54.

According to the CMP technique of the present invention, no residue appeared as illustrated in the step (4) of FIG. 9B and the second interconnect member or plug 54 and third interlayer dielectric film 53 are able to have a common, flat surface. Accordingly, as illustrated in the step (5) FIG. 9B, a third interconnect layer 56 having a minute pattern could be disposed over the third dielectric layer easily by ordinary lithography.

It has come to be possible to control dishing or erosion to 50 nm or less even if four metal interconnect layers are formed by repetition of similar steps.

Figure 10:
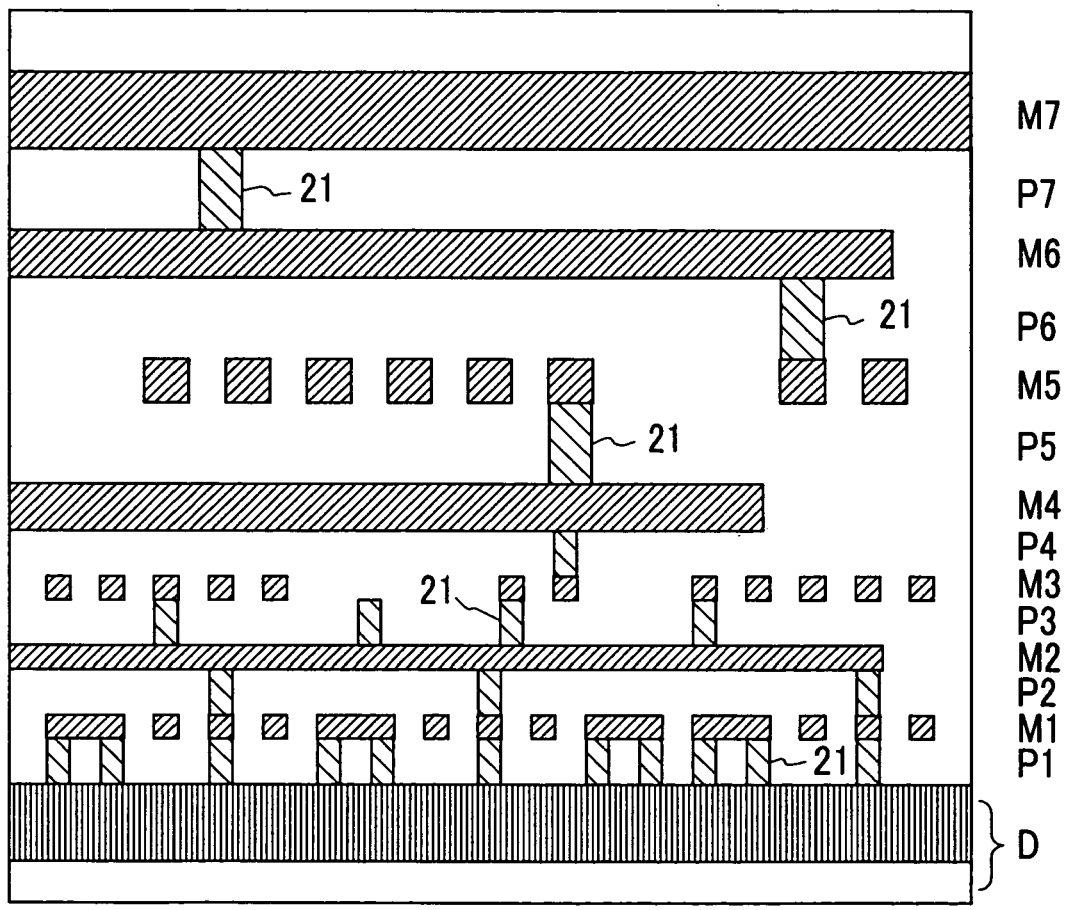
FIG. 10 is a fragmentary cross-sectional view illustrating an electronic circuit device having multilevel metallization according to the present invention.

As illustrated in FIG. 10, it has come to be possible to control dishing or erosion of the uppermost layer to 80 nm or less even if seven metal interconnect layers are formed by CMP according to the present invention. FIG. 10 is a fragmentary cross-sectional view of an electronic circuit device fabricated on trial, wherein indicated at D is a substrate as a base such as semiconductor, P1 to P7 interconnect members or plugs (such plugs may be called "via"), for example, metals such as Cu embedded in an insulating film and M1 to M7 interconnect layers electrically connected therewith.

For the device of FIG. 10, single damascene was adopted. Such a device was obtained by repeating CMP (M1 to M7, P1 to P7) 14 times including the formation of an interconnect member or plug embedded in an interlevel dielectric layer. Even if dual damascene was adopted, dishing or erosion was similarly controlled to 80 nm or less.

In the electronic circuit device having such a multilevel metallization structure, it is desired to flatly form, as illustrated in FIG. 10, at least a main surface level—which is defined by a seventh inlaid interconnect member or plug and an interlevel dielectric film P7 (the uppermost insulating film formed by chemical mechanical polishing) wherein the interconnect member or plug is to be embedded and over which the upper seventh interconnect layer M7 is to be formed—since the tenth or higher interconnect layer is formed in a relatively rough pattern compared with the lower layer, though depending on the using purpose. As described above, the present invention succeeded in the formation of an uppermost insulating-film which has an interconnect member or plug embedded therein with erosion or dishing being suppressed to 80 nm or less and therefore has a substantially flat main surface level (substantially flat level with a difference of unevenness not greater than 80 nm). In addition, this flat common main surface extended over a wide region above the substrate and an insulating film deposited thereover was controlled to have a flatness of 80 nm or less.

Figure 11A:
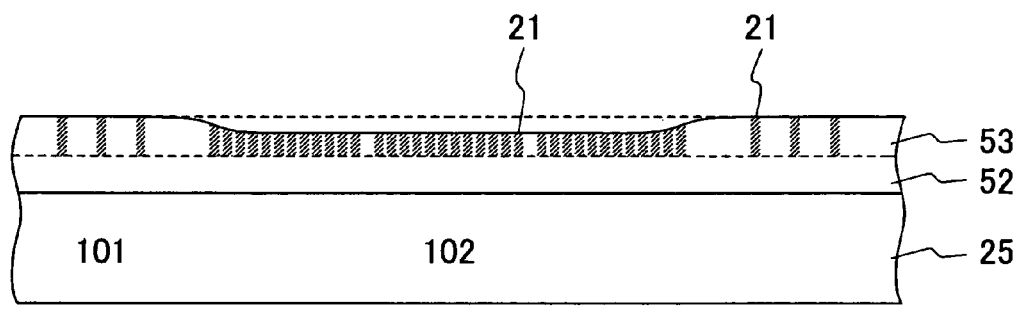
FIG. 11A and FIG. 11B are fragmentary structural views of metallization for illustrating a further advantage of the present invention.
Figure 11B:
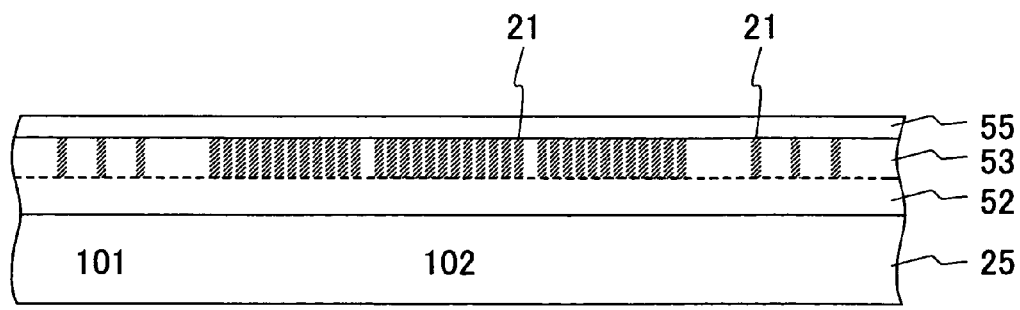

FIGS. 11A and 11B are fragmentary cross-sectional views illustrating the formation of multilevel metallization over a memory array region 102 and a peripheral circuit region 101 such as logic circuit in an LSI chip. On the semiconductor substrate (chip), a large number of semiconductor circuit elements (not illustrated) such as DRAM, SRAM and flash memory are integrated in the memory array region 102 at a markedly higher density than those in the peripheral circuit region 101. Accordingly, in this region, electrodes are densely interconnected above the surface of the semiconductor substrate 25 and compared with the peripheral circuit region, the electrode wiring density is markedly higher by at least 30%.

Between the memory array region 102 and peripheral circuit region 101, there is a large difference in the electrode wiring density. In the conventional polishing method, longer over-CMP time is therefore required for the formation of multilevel metallization above the memory array region 102, which increases erosion or dishing in this region compared with the logic region 101 as illustrated in FIG. 11A. Stacking of such layers causes problems as described in FIG. 9A including the steps (1) to (5) and a drastic increase in the wiring resistance occurred by stacking 3 layers or more.

As a countermeasure against the above-described problem, disposal of many dummy interconnects or dummy plugs on the order of 1 micron having no electrical connection and polishing of an insulating layer or metal film deposited thereover can be considered for equalizing the apparent electrode wiring density, which however presumably causes generation of unnecessary parasitic wiring capacitance.

The polishing method of the present invention, on the other hand, has high durability against over-CMP so that even if an LSI having, within the same chip, portions largely different in the electrode wiring density, dishing or erosion was controlled to be 50 nm or less as illustrated in FIG. 11B by carryout out CMP of the present invention in repetition. The application of the present invention particularly to such an LSI having, in a chip, a memory mat having a considerably large electrode wiring density has made it possible to stack the third interconnect 55 over a substantially flat, common main surface (with a difference of unevenness not greater than 50 nm) of the third plug and interlevel dielectric film 53 as described above. In addition, the present invention has made it possible to form this flat main surface over a semiconductor wafer in spite that semiconductor regions are separated and different in element forming density and wiring density, which will contribute to the development of a larger-scaled LSI in future.

Moreover, even if another interconnect layer is stacked over the thus-formed third interconnect layer, it is possible to form it as a flat layer without increasing wiring resistance.

As apparent from FIGS. 9A, 9B, 10, 11A and 11B, the present invention makes it possible to form a substantially flat uppermost layer having markedly reduced erosion or dishing even when a multilevel metallization structure is formed by repeating chemical mechanical polishing many times (at least three times), which brings about various advantages as described below upon fabrication of an LSI or electronic circuit device: (1) suppression of Cu wiring resistance to conform to the design standard for LSI and (2) reduction in the difference of wiring resistance within one wafer surface without over-CMP. In addition, (3) optical focusing is facilitated and processing can be conducted with high precision in the lithography step of a layer overlying the Cu interconnect, whereby (4) when a damascene interconnect is formed thereover, polishing residue can be prevented. (5) It is not necessary to dispose a useless dummy interconnect or plug (via).

(Embodiment 2)

An abrasive-free polishing liquid for Cu used in this Embodiment is an aqueous solution made of aqueous hydrogen peroxide (a commercially available aqueous 30% $H_2O_2$ solution), phosphoric acid and polyammonium acrylate. It contains 30 wt. % of aqueous hydrogen peroxide, 0.2 wt. % of phosphoric acid and 0.1 wt. % of polyammonium acrylate. The removal rate and etching rate of the Cu film were measured using the polishing liquid. The polishing properties were evaluated in a similar manner to Embodiment 1. For polishing of a barrier metal film, employed was a polishing liquid obtained by adding, to the above-described polishing liquid, a silica abrasive in an amount of 1%.

As a result, the removal rate and etching rate of Cu were controlled to 500 nm/min and not greater than 1.0 nm/min, respectively, suggesting that the polishing liquid employed was free from the problem of dishing. The removal rate was about 5 times as much as that of the conventional organic-acid type abrasive-free polishing liquid. The removal rate of $SiO_2$ was 0.1 nm/min or less, suggesting that the polishing liquid employed was free from the problem of erosion.

The removal rate of a barrier metal TiN by the polishing liquid to which a silica abrasive was added in an amount of 1% was 100 nm/min. In this Embodiment, TiN was employed, but instead, Ta and TaN can be tested in a similar manner except for the polishing time. The removal rates of Ta and TaN were 40 nm/min and 50 nm/min, respectively, while that of $SiO_2$ was 1 nm/min or less.

As a result of CMP of a sample to have an inlaid interconnect formed therein by two steps with the above-described polishing liquids, it was processed into a shape having dishing or erosion suppressed to about 50 nm or less as illustrated in FIGS. 3D and 3E. The polishing of Cu was completed within a time about the one-fifth of that using the conventional organic-acid type abrasive-free polishing liquid. It caused neither delamination or polishing scratches.

A plug was also formed into a shape having dishing or erosion suppressed to about 50 nm or less as illustrated in FIGS. 4D and 4E.

The electric resistance of the Cu interconnect thus formed was measured, resulting in 1.9 micro-ohm-cm which includes that of the TiN layer. The open/short failure test using a zigzag interconnect (interconnect width: 0.3 micro meter to 3 micro meter, length: 40 mm) or comb-like interconnect (distance between interconnects: 0.3 micro meter to 3 micro meter, length: 40 mm) was conducted, resulting in a yield of about 100%.

According to this Embodiment, multilevel metallization structures as illustrated in FIGS. 5A, 5B, 6A, 6B, 7A and 7B were also fabricated. In any case, the LSI worked normally. In addition, application of this Embodiment to an electronic circuit system or LSI having such multilevel metallization as illustrated in FIG. 10 or 11B has proved that almost similar advantages as described in Embodiment 1 were available from it.

In Embodiment 2, polyammonium acrylate was employed. Addition of cetyl pyridinium chloride, instead of it, in the same concentration attained the above-described removal rate and at the same time, prevented the generation of mold or bacteria during storage of the polishing liquid or in its waste.

Polyammonium acrylate employed in Embodiment 2 had a molecular weight of about 10000, but the removal rate of Cu was increased by 20% by using polyammonium acrylate having a molecular weight of about 100000. When bridged polyammonium acrylate having a molecular weight exceeding 1000000 was employed, the removal rate of Cu was increased by 30%.

To the polishing liquid employed in Embodiment 2, BTA was added in an amount of 0.2 wt. % as a second protection-layer forming agent, which made it possible to increase the removal rate of Cu by 50%.

(Embodiment 3)

A polishing liquid used in this Embodiment is an aqueous solution made of aqueous hydrogen peroxide (a commercially available aqueous 30% $H_2O_2$ solution), phosphoric acid, BTA and methanol. It contains 30 wt. % of aqueous hydrogen peroxide, 0.2 wt. % of phosphoric acid, 0.2 wt. % of BTA and 1 wt. % of methanol. Another polishing liquid was prepared by adding a silica abrasive to the above polishing liquid in an amount of 1%. The removal rate and etching rate of the Cu film were measured using these two polishing liquids. The polishing properties were evaluated in a similar manner to Embodiment 1.

When the silica-abrasive-containing polishing liquid was employed, the removal rate of Cu was 800 nm/min and the etching rate was suppressed to 1.0 nm/min or less, suggesting that it was free from the problem of dishing. The removal rate of Cu by the silica-abrasive-free polishing liquid was 550 nm/min, similar to that of Embodiment 1.

The removal rate of TiN by the silica-abrasive-containing polishing liquid was 100 nm/min, while that by the silica-abrasive-free polishing liquid was 20 nm/min. The removal rate of Ta was 40 nm/min when polished by the abrasive-containing polishing liquid and 10 nm/min by the abrasive-free one. The removal rate of TaN was 50 nm/min when polished by the abrasive-containing polishing liquid and 15 nm/min by the abrasive-free one. In the below-described test, TiN was employed as a barrier metal film. It is possible to carry out the test on each of Ta and TaN in a similar manner except for the polishing time.

By using a sample, as shown in FIG. 3A, to have an inlaid Cu interconnect formed therein, the state of the Cu interconnect obtained by one-step CMP (polishing of a Cu film and a TiN film successively by the second platen 11 of FIG. 2) with the above-described silica-abrasive-containing polishing liquid and that obtained by two-step CMP similar to Embodiment 1 were compared. In the former case, the Cu interconnect was processed into a shape as shown in FIG. 8A and erosion of 50 nm or greater appeared, while dishing was suppressed to 50 nm or less. In the latter case, as a result of observation of the sample at portions having the same metallization structure, a substantially flat surface was formed as illustrated in FIG. 8B, suggesting that the presence or absence of an abrasive has an influence on the size of erosion.

Inspection by a surface-defect detector indicated that several tens to hundreds of scratches per wafer appeared by one-step CMP.

In spite of such a problem, the one-step CMP is advantageous from the viewpoint of improvement in throughput, because the one-step CMP required a polishing time the one-third of that of the two-step CMP if polishing of TiN was included.

The electric resistance of the Cu interconnect formed by one-step CMP was measured, resulting in 1.9 micro-ohm-cm including that of the TiN layer (with a decrease in the film thickness taken in consideration). The wiring resistance was however about 10% higher than that of the two-step CMP, which is presumed to owe to a large erosion. The open/short failure test using a zigzag interconnect (interconnect width: 0.3 micro meter to 3 micro meter, length: 40 mm) or comb-like interconnect (distance between interconnects: 0.3 micro meter to 3 micro meter, length: 40 mm) was conducted, resulting in a yield of almost 100%.

An LSI was fabricated on trial in a similar manner to Embodiment 1 by stacking interconnects as illustrated in FIG. 5A, 5B, 6A, 6B, 7A, 7B, 10 or 11B. It exhibited similar advantages. As a result of inspection, the LSI was confirmed to have normal circuit performance.

(Embodiment 4)

In this Embodiment 4, a description will be made of a complete abrasive-free process wherein a barrier metal is removed by dry etching subsequent to polishing of Cu with an abrasive-free polishing liquid.

Dry etching was carried out using an $SF_6$ (sulfur hexafluoride) gas under the conditions of a gas flow rate of 25 cc/min, treating pressure of 5 mm Torr, and high-frequency output of 600 W for plasma and 0 to 100 W for bias.

Under the above-described conditions, an etching selectivity between a barrier metal film and an $SiO_2$ film was studied. The higher the bias electric power, the more etching rate increased. The selectivity became highest when no bias power was applied. At a bias power of 0, the $TiN/SiO_2$ selectivity was 15, while $TaN/SiO_2$ selectivity was 11.

It is presumed that the selectivity increased when no bias power was applied, because F radicals are effective for etching of TiN or TaN, but $SiO_2$ is not etched easily only by F radicals so that an ion accelerating effect by the application of bias power is necessary.

It was confirmed that Cu was not etched at all under the above-described conditions.

The dry etching rates of TiN and TaN were 320 nm/min and 240 nm, respectively.

A method for forming a Cu interconnection or plug by the above-described dry etching method will next be described more specifically. In the below-described method, TaN was used as a barrier metal. Utterly similar results are available by the use of TiN instead.

A sample as illustrated in FIGS. 3A to 3E or FIGS. 4A to 4E was prepared and Cu was subjected to CMP by using a phosphoric-acid-type abrasive-free polishing liquid as described in another embodiment. After brush scrub cleaning and drying of the wafer, the TaN film was removed by a dry etching apparatus under the above-described conditions. As a result, the interconnect was formed as illustrated in FIGS. 3D and 3E while suppressing dishing or erosion to about 50 nm or less.

The plug was also formed to have a flat structure as illustrated in FIGS. 4D and 4E. The Cu film was formed by a known electroplating method in order to improve the embedding properties. As a result, the above-described dry etching method made it possible to form the plug while suppressing dishing or erosion to about 50 nm or less. Neither delamination nor scratches appeared.

The electric resistance of the Cu interconnect formed by the above-described method was measured, resulting in 1.9 micro-ohm-cm including that of the TaN layer. The open/short failure test using a zigzag interconnect (interconnect width: 0.3 micro meter to 3 micro meter, length: 40 mm) or comb-like interconnect (distance between interconnects: 0.3 micro meter to 3 micro meter, length: 40 mm) was conducted, resulting in a yield of almost 100%.

It was confirmed that normal conduction was attained through a tungsten plug 42 from an impurity doped layer 45 as illustrated in FIGS. 5A and 5B and LSI worked normally.

According to this Embodiment, a multilevel metallization structure as illustrated in FIGS. 6A and 6B was formed by repeating manufacturing steps of the interconnect structure of FIGS. 3A to 3E and plug structure of FIGS. 4A to 4E. The conduction yield of the plug was almost 100% and the normal performance of LSI was confirmed.

It was possible to use either Cu or tungsten as a plug material, because in either case, conduction was attained. Formation of a tungsten film by CVD is advantageous from the viewpoint of embedding properties and it does not require a metal film for adhesion. In this embodiment, the plug was formed by the CMP of a tungsten film.

According to this Embodiment, it was also possible to form a plug 41 by the dual-damascene method as illustrated in FIGS. 7A and 7B, which made it possible to reduce the number of steps for multilevel metallization. Also in this method, the LSI was confirmed to have normal performance.

An LSI was fabricated on trial by stacking interconnects in a similar manner to Embodiment 1 as illustrated in FIG. 5A, 5B, 6A, 6B, 7A, 7B, 10 or 11B, whereby substantially similar advantages were available. As a result of inspection, the LSI was confirmed to work normally.

(Embodiment 5)

The polishing liquid employed in Embodiment 5 was an aqueous solution made of aqueous hydrogen peroxide (a commercially available aqueous 30% $H_2O_2$ solution), phosphoric acid, BTA, methanol and malonic acid. It contains 30 wt. % of aqueous hydrogen peroxide, 0.2 wt. % of phosphoric acid, 0.2 wt. % of BTA, 1 wt. % of methanol and 0.1 wt. % malonic acid. The removal rate and etching rate of the Cu film were measured using the polishing liquid. The polishing properties were evaluated in a similar manner to Embodiment 1.

As a result, the removal rate was 600 nm/min and etching rate was controlled to 1.0 nm/min or less, suggesting that the polishing liquid was free from the problem of dishing. Compared with the polishing liquid of Embodiment 1, its removal rate is by 50 nm/m greater and the observation through a scanning electron microscope (SEM) indicated that the polished surface of Cu has improved smoothness.

A sample to have an inlaid interconnect formed therein as illustrated in FIG. 3A was subjected to CMP by the above-described polishing liquid, resulting in the formation of the interconnect into a shape having dishing or erosion suppressed to about 50 nm or less as illustrated in FIGS. 3D and 3E. Polishing was completed within a time the one-sixth of that of the conventional organic-acid-type abrasive-free polishing liquid. Neither delamination nor scratches appeared.

The plug structure was also formed as illustrated in FIGS. 4D and 4E while suppressing dishing or erosion to about 50 nm or less.

The electric resistance of the Cu interconnect formed by the above-described method was measured, resulting in 1.9 micro-ohm-cm including that of the TiN layer. The open/short failure test using a zigzag interconnect (interconnect width: 0.3 micro meter to 3 micro meter, length: 40 mm) or comb-like interconnect (distance between interconnects: 0.3 micro meter to 3 micro meter, length: 40 mm) was conducted, resulting in a yield of about 100%.

According to this Embodiment, it was also possible to fabricate a multilevel metallization structure as illustrated in FIGS. 5A, 5B, 6A and 6B. The LSI thus obtained was found to work normally.

In addition, an LSI was fabricated on trial by stacking interconnects in a similar manner to Embodiment 1 as illustrated in FIG. 5A, 5B, 6A, 6B, 7A, 7B, 10 or 11B, resulting in advantages almost similar to those of Embodiment 1. As a result of inspection, the LSI was found to work normally.

What is claimed is:

1. A polishing method for a copper film by chemical mechanical polishing, comprising forming a protection-layer on the copper film with a forming agent, polishing the protection-layer away on a convex portion of the copper film, oxidizing a surface of the convex portion of the copper film by an oxidizing substance and rendering an oxidized substance water soluble by phosphoric acid, wherein a polishing liquid used in said polishing contains an oxidizing substance, a phosphoric acid and a protection-layer forming agent and methyl alcohol.

2. A polishing method according to claim 1, wherein said oxidizing substance contains hydrogen peroxide, and said phosphoric acid contains one selected from the group of orthophosphoric acid and phosphorous acid.

3. A polishing method according to claim 2, wherein said protection-layer forming agent contains benzotriazole.

4. A polishing method according to claim 2, wherein said protection-layer forming agent contains a carboxyl-containing polymer.

5. A polishing method according to claim 2, wherein said polishing slurry contains abrasives not more than 1 wt %.

6. A polishing method for removing a copper film over an insulating film by chemical mechanical polishing, comprising forming a protection-layer with benzotriazole and, polishing the protection-layer away on a convex portion of the copper film, oxidizing a surface of the convex portion of the copper film by an oxidizing substance and rendering an oxidized copper film water soluble by a phosphoric acid, wherein a polishing liquid used in said polishing contains an oxidizing substance, a phosphoric acid, malonic acid, a benzotriazole and methyl alcohol.

7. A polishing method according to claim 6, wherein said oxidizing substance contains hydrogen peroxide, said phosphoric acid contains one selected from the group of orthophosphoric acid and phosphorous acid.

8. A polishing method according to claim 6, wherein said polishing slurry contains abrasives not more than 1 wt %.

9. A polishing method according to claim 8, wherein said oxidizing substance contains hydrogen peroxide, said phosphoric acid contains one selected from the group of orthophosphoric acid and phosphorous acid, and said protection-layer forming agent contains benzotriazole.

10. A polishing method according to claim 8, wherein said oxidizing substance contains hydrogen peroxide, said phosphoric acid contains one selected from the group of orthophosphoric acid and phosphorous acid, and said protection-layer forming agent contains a carboxyl-containing polymer.

11. A polishing method according to claim 8, wherein said oxidizing substance contains hydrogen peroxide, said phosphoric acid contains one selected from the group of orthophosphoric acid and phosphorous acid, and said protection-layer forming agent contains one selected from the group of polyacrylic acid, polyammonium acrylate polyamine acrylate, and a bridged polymer thereof.

12. A polishing method according to claim 8, wherein said polishing slurry for first metal film contains abrasives not more than 1 wt %.

13. A polishing method comprising the steps of:
   (a) depositing a first metal film of a barrier metal on an insulating film having convex and concave portions and depositing a second metal film of copper on the first metal film;
   (b) removing the second metal film on the convex portion and leaving the second metal film in the concave portion on the first metal by chemical mechanical polishing comprising forming a protection-layer with a forming agent on a surface of the second metal film, polishing the protection-layer away on a convex portion of the surface, oxidizing a surface of a convex portion of the second metal film by an oxidizing substance and rendering the oxidized metal water soluble by a phosphoric acid, wherein a polishing liquid used in said polishing contains an oxidizing substance, a phosphoric acid and a protection-layer forming agent and methyl alcohol;
   (c) removing the first metal film on the convex portion and leaving the first metal in the concave portion by chemical mechanical polishing by a polishing liquid containing an oxidizing substance, a phosphoric acid, a protection-layer forming agent comprised of an anticorrosive.

14. A polishing method comprising the steps of:
   (a) depositing a first metal film of a barrier metal on an insulating film having convex and concave portions and depositing a second metal film of copper on the first metal film;
   (b) removing the second metal film on the convex portion and leaving the second metal film in the concave portion on the first metal by chemical mechanical polishing comprising forming a protection-layer with a forming agent on a surface of the second metal film, polishing the protection-layer away on a convex portion of the surface, oxidizing a surface of a convex portion of the second metal film by an oxidizing substance and rendering the oxidized metal water soluble by a phosphoric acid, wherein a polishing liquid used in said polishing contains oxidizing substance, a phosphoric acid, malonic acid, a protection-layer forming agent and methyl alcohol;
   (c) removing the first metal film on the convex portion and leaving the first metal in the concave portion by chemical mechanical polishing by a polishing liquid containing an oxidizing substance, a phosphoric acid, a protection-layer forming agent comprised of an anticorrosive.

15. A polishing method according to claim 14, wherein said oxidizing substance contains hydrogen peroxide, said phosphoric acid contains one selected from the group of orthophosphoric acid and phosphorous acid, and said protection-layer forming agent contains benzotriazole.

16. A polishing method according to claim 14, wherein said oxidizing substance contains hydrogen peroxide, said phosphoric acid contains one selected from the group of orthophosphoric acid and phosphorous acid, and said protection-layer forming agent contains a carboxyl-containing polymer.

17. A polishing method according to claim 14, wherein said oxidizing substance contains hydrogen peroxide, said phosphoric acid contains one selected from the group of orthophosphoric acid and phosphorous acid, and said protection-layer forming agent contains one selected from the group of polyacrylic acid, polyammonium acrylate polyamine acrylate, and a bridged polymer thereof.

18. A polishing method according to claim 14, wherein said polishing slurry for first metal film contains abrasives not more than 1 wt %.

* * * * *